(12) United States Patent
Potkins et al.

(10) Patent No.: US 11,205,560 B2
(45) Date of Patent: Dec. 21, 2021

(54) ION IMPLANTER AND BEAM PROFILER

(71) Applicant: SUMITOMO HEAVY INDUSTRIES ION TECHNOLOGY CO., LTD., Tokyo (JP)

(72) Inventors: David Edward Potkins, Nelson (CA); Phillip Thomas Jackle, Burnaby (CA)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 17/085,458

(22) Filed: Oct. 30, 2020

(65) Prior Publication Data
US 2021/0134559 A1    May 6, 2021

(30) Foreign Application Priority Data
Nov. 1, 2019    (JP) .............................. JP2019-200052

(51) Int. Cl.
*H01J 37/00* (2006.01)
*H01J 37/317* (2006.01)

(52) U.S. Cl.
CPC ... *H01J 37/3171* (2013.01); *H01J 2237/0453* (2013.01); *H01J 2237/20228* (2013.01); *H01J 2237/24528* (2013.01); *H01J 2237/24535* (2013.01); *H01J 2237/24542* (2013.01)

(58) Field of Classification Search
USPC .................................................. 250/492.21
See application file for complete search history.

(56) References Cited

U.S. PATENT DOCUMENTS

| | | | | |
|---|---|---|---|---|
| 4,724,324 A | * | 2/1988 | Liebert ............... | H01J 37/3171 250/397 |
| 6,690,022 B2 | * | 2/2004 | Larsen ................. | H01J 37/304 250/396 R |
| 7,109,483 B2 | * | 9/2006 | Nakasuji ............. | G01N 23/225 250/307 |
| 9,218,938 B2 | * | 12/2015 | Cheng ................. | H01J 37/3171 |
| 9,564,292 B2 | * | 2/2017 | Ido ....................... | H01J 37/244 |
| 10,222,400 B2 | | 3/2019 | Une et al. | |
| 2006/0097195 A1 | * | 5/2006 | Angel .................. | G01T 1/29 250/492.21 |

FOREIGN PATENT DOCUMENTS

| | | |
|---|---|---|
| JP | 2002-329472 A | 11/2002 |
| JP | 2015-011770 A | 1/2015 |
| JP | 2017-199554 A | 11/2017 |
| JP | 2018-049809 A | 3/2018 |

* cited by examiner

*Primary Examiner* — Phillip A Johnston
(74) *Attorney, Agent, or Firm* — Michael Best & Friedrich LLP

(57) ABSTRACT

An ion implanter includes a beam scanner that performs a scanning with an ion beam in a scanning direction perpendicular to a traveling direction of the ion beam, and a beam profiler that is disposed downstream of the beam scanner and measures a beam current distribution of the ion beam when the scanning by the beam scanner is performed. The beam profiler includes an aperture array that includes a first aperture and a second aperture, a cup electrode array that is disposed to be fixed with respect to the aperture array, the cup electrode array including a first cup electrode and a second cup electrode, and a plurality of magnets.

18 Claims, 8 Drawing Sheets

ION IMPLANTER AND BEAM PROFILER

RELATED APPLICATIONS

The content of Japanese Patent Application No. 2019-200052, on the basis of which priority benefits are claimed in an accompanying application data sheet, is in its entirety incorporated herein by reference.

BACKGROUND

Technical Field

Certain embodiments of the present invention relate to an ion implanter and a beam profiler.

Description of Related Art

In a semiconductor manufacturing process, a process of implanting ions into a semiconductor wafer is normally carried out in order to change conductivity of a semiconductor or to change a crystal structure of the semiconductor. A beam current measurer in which a plurality of Faraday cups are disposed side by side with each other in order to measure a beam current distribution of an ion beam is known (for example, refer to the related art).

SUMMARY

According to an aspect of the present invention, there is provided an ion implanter including a beam scanner that performs a scanning with an ion beam in a scanning direction perpendicular to a traveling direction of the ion beam and a beam profiler that is disposed downstream of the beam scanner and measures a beam current distribution of the ion beam when the scanning by the beam scanner is performed. The beam profiler includes an aperture array, a cup electrode array that is disposed to be fixed with respect to the aperture array, and a plurality of magnets. The aperture array includes a first aperture which provides a first beam portion of the ion beam and a second aperture which has a shape different from that of the first aperture when viewed from an upstream side in the traveling direction and provides a second beam portion of the ion beam. The cup electrode array includes a first cup electrode which defines a first cavity and is disposed such that the first beam portion is incident from the first aperture through the first cavity and a second cup electrode which defines a second cavity and is disposed such that the second beam portion is incident from the second aperture through the second cavity. The plurality of magnets apply a magnetic field to the first cavity and the second cavity along an in-plane direction in a plane perpendicular to the traveling direction.

According to another aspect of the present invention, there is provided a beam profiler including an aperture array, a cup electrode array that is disposed to be fixed with respect to the aperture array, and a plurality of magnets. The aperture array includes a first aperture and a second aperture which has a shape different from that of the first aperture when viewed from an upstream side in a traveling direction of an ion beam. The first aperture provides a first beam portion of the ion beam, and the second aperture provides a second beam portion of the ion beam. The cup electrode array includes a first cup electrode which defines a first cavity and is disposed such that the first beam portion is incident from the first aperture through the first cavity and a second cup electrode which defines a second cavity and is disposed such that the second beam portion is incident from the second aperture through the second cavity. The plurality of magnets apply a magnetic field to the first cavity and the second cavity along an in-plane direction in a plane perpendicular to the traveling direction.

Any combination of the components described above or any combination obtained by switching the components or expressions of the present invention between methods, devices, and systems is also effective as an aspect of the present invention.

DETAILED DESCRIPTION

When an ion beam is incident into an electrode of a Faraday cup, charged particles such as secondary electrons and secondary ions can be emitted from an electrode surface. When the emitted charged particles are escaped to the outside of the Faraday cup without being captured again by the electrode, measurement results by the Faraday cup do not accurately represent a beam current of the incident ion beam. Moreover, the charged particles escaped from the Faraday cup may flow into another Faraday cup nearby. Then, a beam current measured by the other Faraday cup also becomes inaccurate.

It is desirable to accurately measure a beam current distribution of an ion beam.

Hereinafter, an embodiment according to the present invention will be described in detail with reference to the drawings. In the description and drawings, the same or equivalent components, members, or processes will be assigned with the same reference symbol, and redundant description thereof will be omitted as appropriate. The scales and shapes of the illustrated parts are set for convenience in order to make the description easy to understand, and are not to be understood as limiting unless stated otherwise. The embodiment is merely an example and does not limit the scope of the present invention. All characteristics and combinations to be described in the embodiment are not necessarily essential to the invention.

Figure 1:
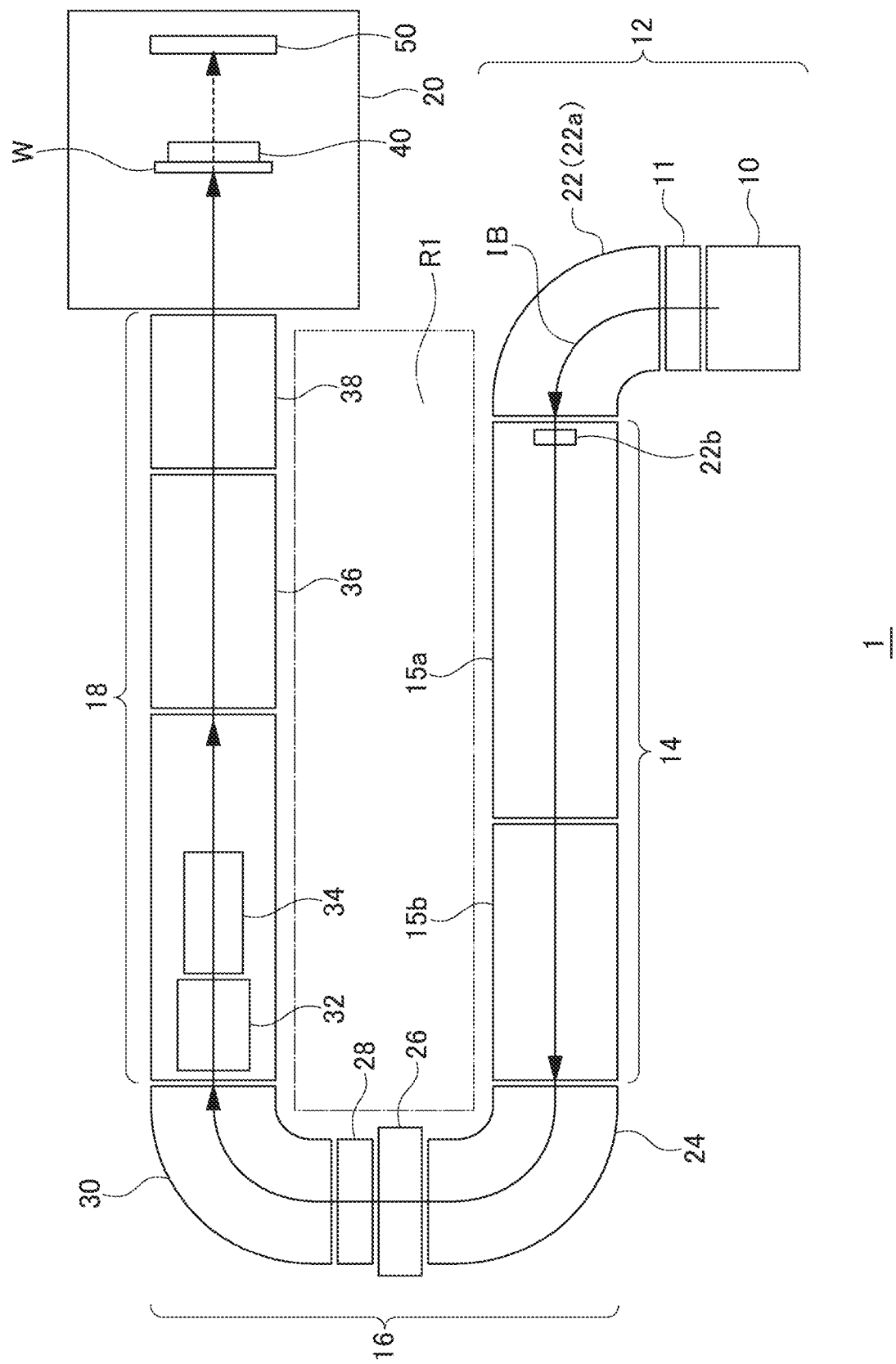
FIG. 1 is a top view schematically illustrating an ion implanter according to an embodiment.

FIG. 1 is a top view schematically illustrating an ion implanter 1 according to an embodiment of the present invention. The ion implanter 1 is a so-called high energy ion implanter. The high energy ion implanter is an ion implanter that has a radio frequency linear acceleration-type ion accelerator and a beamline for high energy ion transport, accelerates ions generated by an ion source 10, transports a resultant ion beam IB to an object to be processed (for example, a substrate or a wafer W) along the beamline, and implants the ions into the object to be processed.

The high energy ion implanter 1 includes an ion beam generation unit 12 that generates ions and performs mass separation, a high energy multistage linear acceleration unit 14 that accelerates an ion beam into a high energy ion beam, a beam deflection unit 16 that performs energy analysis, trajectory correction, and control of energy dispersion of a high energy ion beam, a beam transport line unit 18 that transports an analyzed high energy ion beam to the wafer W, and a substrate transferring/processing unit 20 that implants a transported high energy ion beam into the wafer W.

The ion beam generation unit 12 includes the ion source 10, an extraction electrode 11, and a mass analyzer 22. In the ion beam generation unit 12, a beam is accelerated simultaneously with extraction from the ion source 10 through the extraction electrode 11, and the extracted and accelerated beam is subjected to mass analysis by the mass analyzer 22. The mass analyzer 22 has a mass analyzing magnet 22a and a mass resolving slit 22b. Although there is also a case where the mass resolving slit 22b is disposed immediately after the mass analyzing magnet 22a, the mass resolving slit 22b is disposed in an entrance of the high energy multistage linear acceleration unit 14, which is the following configuration, in the embodiment. As a result of the mass analysis by the mass analyzer 22, only ion species necessary for implantation is selected, and an ion beam of the selected ion species is led to the following high energy multistage linear acceleration unit 14.

The high energy multistage linear acceleration unit 14 includes a plurality of linear acceleration mechanisms that accelerate an ion beam, that is, acceleration gaps sandwiching one or more radio frequency resonators. The high energy multistage linear acceleration unit 14 can accelerate ions by the action of a radio frequency (RF) electric field. The high energy multistage linear acceleration unit 14 includes a first linear accelerator 15a including a standard multistage of radio frequency resonators for high energy ion implantation. The high energy multistage linear acceleration unit 14 may include a second linear accelerator 15b including an additional multistage of radio frequency resonators for ultra high energy ion implantation.

A high energy ion beam exiting from the radio frequency-type high energy multistage linear acceleration unit 14 that accelerates the ion beam to high energy has a certain range of energy distribution. For this reason, in order to irradiate a wafer with a high energy ion beam, which is subjected to beam scanning and beam parallelization, in a downstream side of the high energy multistage linear acceleration unit 14, it is necessary to carry out high-accuracy energy analysis, trajectory correction, and the adjustment of beam convergence and divergence in advance.

The beam deflection unit 16 performs energy analysis, trajectory correction, and energy dispersion control of the high energy ion beam. The beam deflection unit 16 includes at least two high-accuracy bending electromagnets, at least one energy width limiting slit, at least one energy resolving slit, and at least one horizontally focusing device. The plurality of bending electromagnets are configured to perform energy analysis, accurate correction of an ion implantation angle, and suppression of energy dispersion of the high energy ion beam.

The beam deflection unit 16 has an energy analysis electromagnet 24, a horizontally focusing quadrupole lens 26 that suppresses energy dispersion, an energy resolving slit 28, and a bending electromagnet 30 that provides beam steering (trajectory correction). The energy analysis electromagnet 24 is also called an energy filter electromagnet (EFM) in some cases. The high energy ion beam accelerated by the high energy multistage linear acceleration unit 14 is redirected by the beam deflection unit 16 toward the wafer W.

The beam transport line unit 18 is a beamline device that transports the ion beam IB exiting from the beam deflection unit 16, and includes a beam shaper 32 configured with a focusing/defocusing lens group, a beam scanner 34, a beam parallelizer 36, and a final energy filter 38 (including a final energy separation slit). The length of the beam transport line unit 18 is designed in accordance with the total length of the ion beam generation unit 12 and the high energy multistage linear acceleration unit 14. The implanter 1 forms a U-shaped layout as a whole by connecting the beam transport line unit 18 and the high energy multistage linear acceleration unit 14 with the beam deflection unit 16.

The substrate transferring/processing unit 20 is provided at a down stream end of the beam transport line unit 18. The substrate transferring/processing unit 20 is provided with a platen driving device 40 that holds the wafer W during ion implantation and moves the wafer W in a direction perpendicular to a beam scanning direction. In addition, the substrate transferring/processing unit 20 is provided with a beam profiler 50. A configuration of the beam profiler 50 will be described in detail later.

A beamline portion of the ion implanter 1 is configured as a horizontal U-shaped folded beamline that has two long straight line portions facing each other. An upstream long straight line portion is configured with a plurality of units that accelerate the ion beam IB generated by the ion beam generation unit 12. A downstream long straight line portion is configured with a plurality of units that adjust the redirected ion beam IB with respect to the upstream long straight line portion and implant the adjusted ion beam IB into the wafer W. The two long straight line portions are configured to have almost the same length. A work space R1 having a sufficient area for maintenance work is provided between the two long straight line portions.

Figure 2:
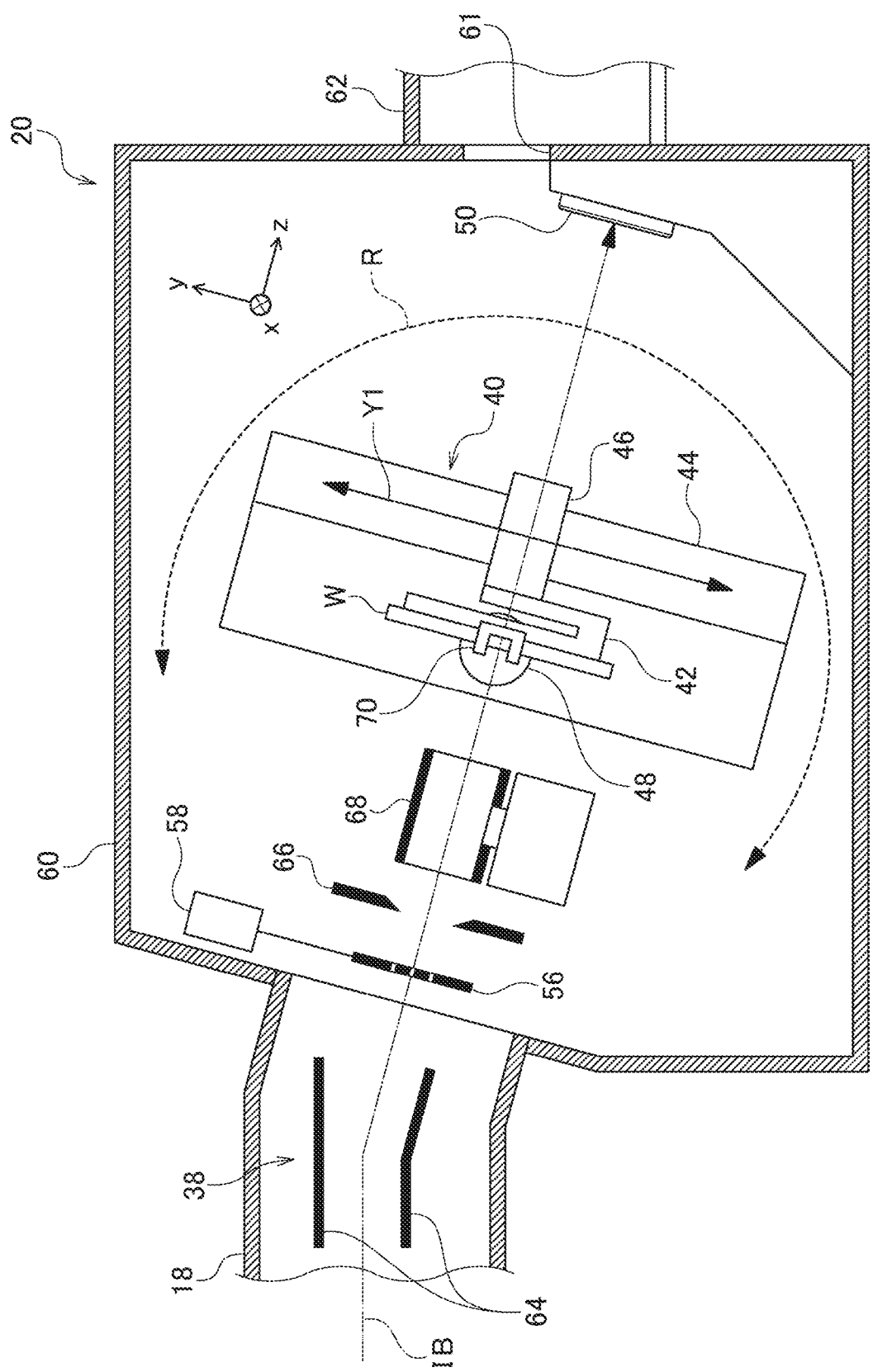
FIG. 2 is a side view illustrating in detail a configuration of a substrate transferring/processing unit according to the embodiment.

FIG. 2 is a side view illustrating a configuration of the substrate transferring/processing unit 20 in detail, and illustrates a configuration on the downstream side of the final energy filter 38. The ion beam IB is deflected downward by angular energy filter (AEF) electrodes 64 of the final energy filter 38 and is incident into the substrate transferring/processing unit 20. The substrate transferring/processing unit 20 includes an implantation processing chamber 60 where an ion implantation process is performed on the wafer W and a substrate transferring unit 62 provided with a transferring mechanism for transferring the wafer W. The implantation processing chamber 60 and the substrate transferring unit 62 are connected to each other via a substrate transferring port 61.

The implantation processing chamber 60 includes the platen driving device 40 that holds one or a plurality of wafers W. The platen driving device 40 includes a wafer holding device 42, a reciprocating mechanism 44, a twist angle adjusting mechanism 46, and a tilt angle adjusting mechanism 48. The wafer holding device 42 includes an electrostatic chuck for holding the wafer W. The reciprocating mechanism 44 reciprocates the wafer holding device 42 in a reciprocating direction (y-direction) perpendicular to the beam scanning direction (x-direction) to reciprocate the wafer W held by the wafer holding device 42 in the y-direction. In FIG. 2, the reciprocation of the wafer W is indicated with an arrow Y1.

In the embodiment, the beam scanning direction (x-direction) corresponds to a horizontal direction. A traveling direction (z-direction) of the ion beam IB in the implantation processing chamber 60 faces slightly downward with respect to a horizontal plane as illustrated in FIG. 2 due to the deflection by the AEF electrodes 64. For this reason, a reciprocating direction of the wafer W (y-direction) is slightly inclined with respect to a vertical line toward the downstream side of the beamline. In this specification, the y-direction is referred to as a beam width direction in some cases. The x-direction and the y-direction are perpendicular to the z-direction.

The twist angle adjusting mechanism 46 is a mechanism that adjusts a rotation angle of the wafer W, and adjusts a twist angle between an alignment mark provided on an outer peripheral portion of the wafer and a reference position by rotating the wafer W about a normal line of a wafer processing surface. Herein, the alignment mark of the wafer means a notch or an orientation flat provided on the outer peripheral portion of the wafer, and means a mark that serves as a reference for an angular position in a crystal axis direction of the wafer or a circumferential direction of the wafer. The twist angle adjusting mechanism 46 is provided between the wafer holding device 42 and the reciprocating mechanism 44, and is caused to reciprocate together with the wafer holding device 42.

The tilt angle adjusting mechanism 48 is a mechanism for adjusting an inclination of the wafer W, and adjusts a tilt angle between the traveling direction (z-direction) of the ion beam IB toward the wafer processing surface and the normal line of the wafer processing surface. In the embodiment, out of inclination angles of the wafer W, an angle having an axis in the x-direction as a center axis of rotation is adjusted as the tilt angle. The tilt angle adjusting mechanism 48 is provided between the reciprocating mechanism 44 and an inner wall of the implantation processing chamber 60, and is configured to adjust the tilt angle of the wafer W by rotating the entire platen driving device 40 including the reciprocating mechanism 44 in an R-direction.

The implantation processing chamber 60 is provided with a mask plate 56, an energy slit 66, and a plasma shower device 68 from an upstream side to the downstream side along a trajectory of the ion beam IB. These components are disposed on an upstream side of the platen driving device 40. In addition, the implantation processing chamber 60 is provided with a beam current measurement unit 70 configured to be insertable to an "implantation position" where the wafer W is disposed during ion implantation.

The mask plate 56 is a beam shield member having a plurality of apertures, and apart of the beam passing through the apertures is measured by the beam profiler 50 and/or the beam current measurement unit 70 on the downstream side. The apertures in the mask plate 56 can include at least two types of slits extending in different directions from each other, for example, a vertical slit elongated in the y-direction and a horizontal slit elongated in the x-direction. The mask plate 56 is attached to a mask driving mechanism 58 so as to be movable, is inserted on a beam trajectory for beam measurement, and is retracted from the beam trajectory during implantation. The mask driving mechanism 58 is configured to move the mask plate 56, for example, in the y-direction. By moving in the y-direction during beam measurement, the mask plate 56 may change a position in a beam cross section of a beam portion cut out by the aperture provided in the mask plate 56.

The energy slit 66 is provided on the downstream side of the AEF electrodes 64, and analyzes the energy of the ion beam IB incident into the wafer W together with an operation of the AEF electrodes 64. The energy slit 66 is an energy defining slit (EDS) configured with a horizontally long slit extending in the beam scanning direction (x-direction). The energy slit 66 allows the ion beam IB having a desired energy value or a desired energy range to pass therethrough toward the wafer W and shields the other ion beam components.

The plasma shower device 68 is positioned on the downstream side of the energy slit 66. The plasma shower device 68 supplies low energy electrons to the ion beam IB and the wafer processing surface in accordance with a beam current of the ion beam IB, and suppresses charge-up due to accumulation of positive charges on the wafer processing surface caused by ion implantation. The plasma shower device 68 includes, for example, a shower tube, through which the ion beam IB passes, and a plasma generating device which supplies electrons into the shower tube.

The beam profiler 50 is provided in the most downstream of the beam trajectory and is mounted, for example, below the substrate transferring port 61. When the wafer W and the beam current measurement unit 70 do not exist on the beam trajectory, the ion beam IB is incident into the beam profiler 50. The beam profiler 50 is configured to measure a beam current distribution of the ion beam IB when a scanning is performed by the beam scanner 34. The mask plate 56 may be retracted from the beam trajectory during beam measurement by the beam profiler 50. The beam profiler 50 may be capable of measuring an angular distribution of the ion beam IB in the y-direction together with an operation of the mask plate 56. By providing the beam profiler 50 in the most downstream separated away from the mask plate 56, angular resolution can be improved.

The beam current measurement unit 70 is for measuring a beam current on a surface of the wafer W (wafer processing surface). The beam current measurement unit 70 is movable, is retracted from the implantation position during implantation, and is inserted at the implantation position when the wafer W is not at the implantation position. For example, the beam current measurement unit 70 measures a beam current while moving in the x-direction and obtains the beam current distribution in the beam scanning direction (x-direction). The beam current measurement unit 70 may be configured to be capable of measuring at least one of angular distributions of the ion beam IB in the x-direction and the y-direction together with an operation of the mask plate 56.

Figure 3:
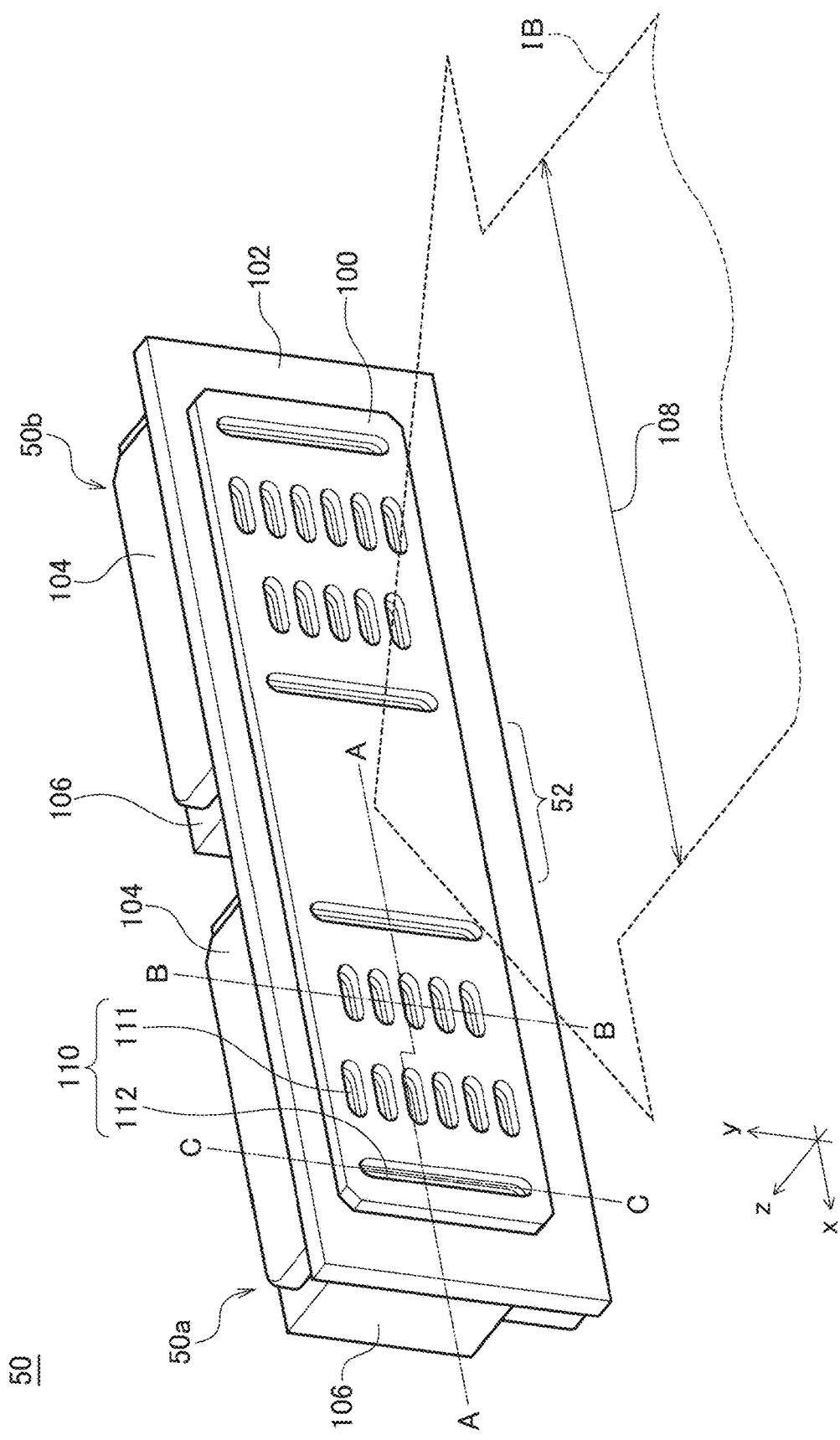
FIG. 3 is a perspective view schematically illustrating an appearance of a beam profiler according to the embodiment.
Figure 4:
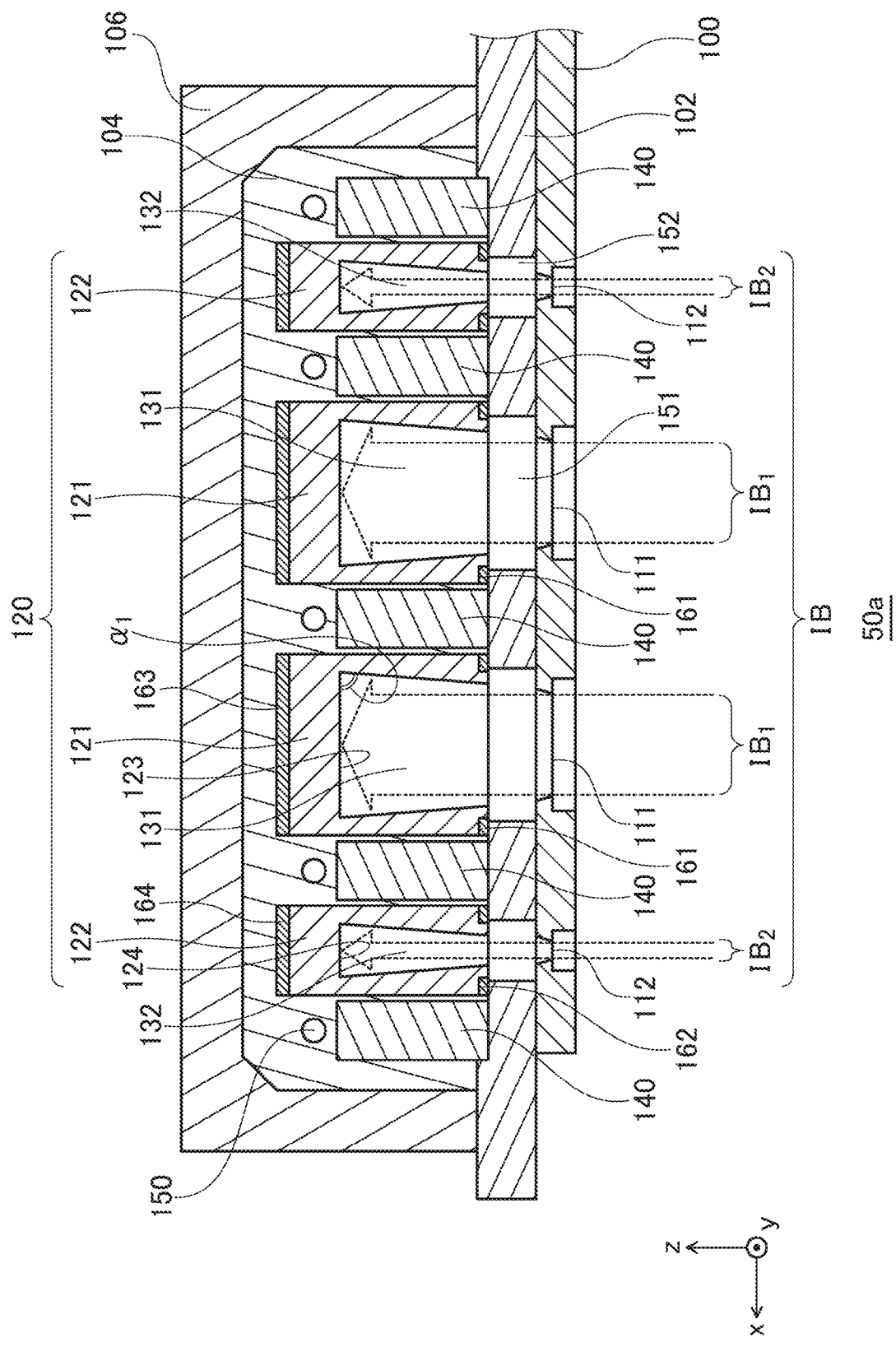
FIG. 4 is a sectional view schematically illustrating an A-A cross section of the beam profiler illustrated in FIG. 3.
Figure 5:
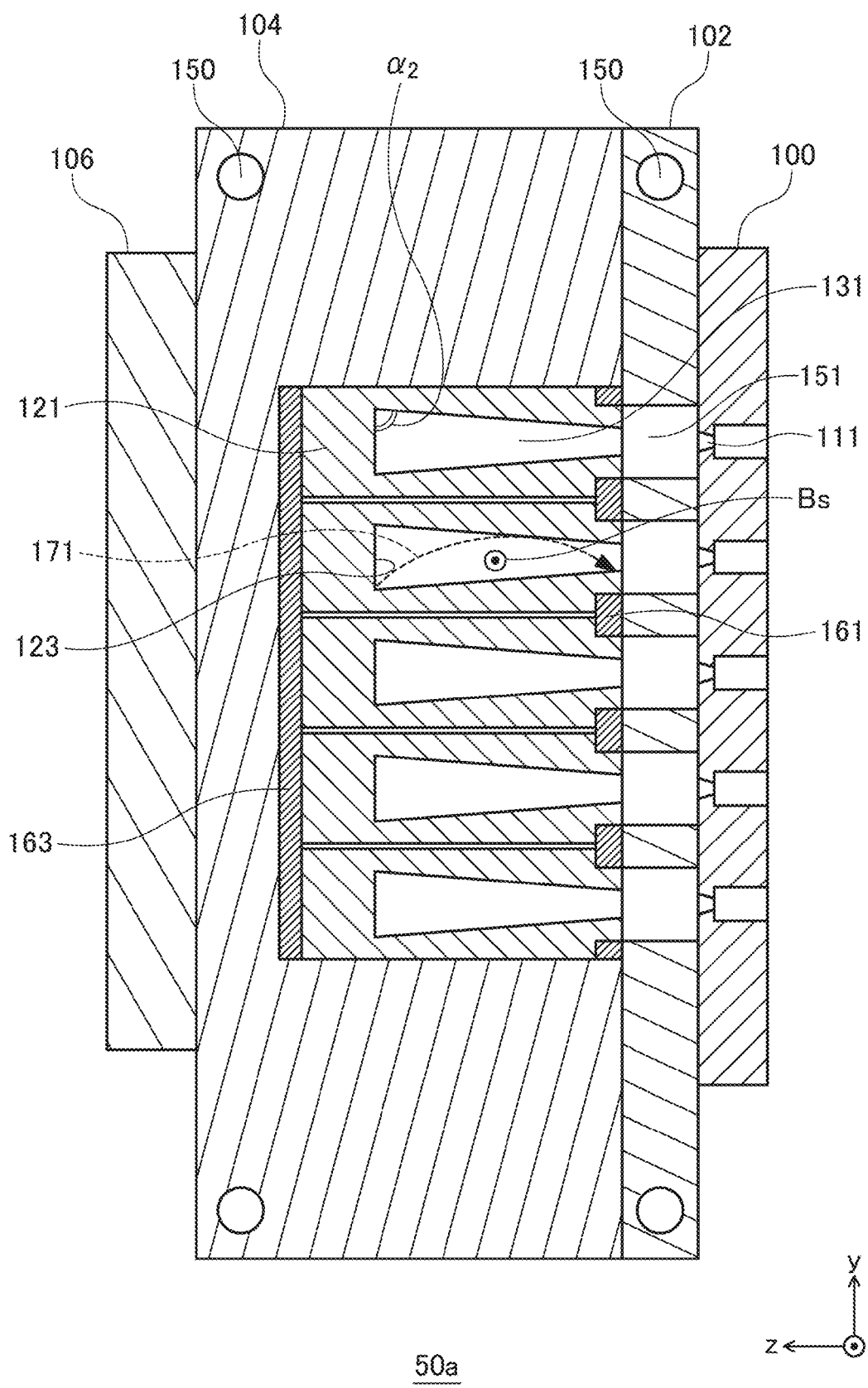
FIG. 5 is a sectional view schematically illustrating a B-B cross section of the beam profiler illustrated in FIG. 3.
Figure 6:
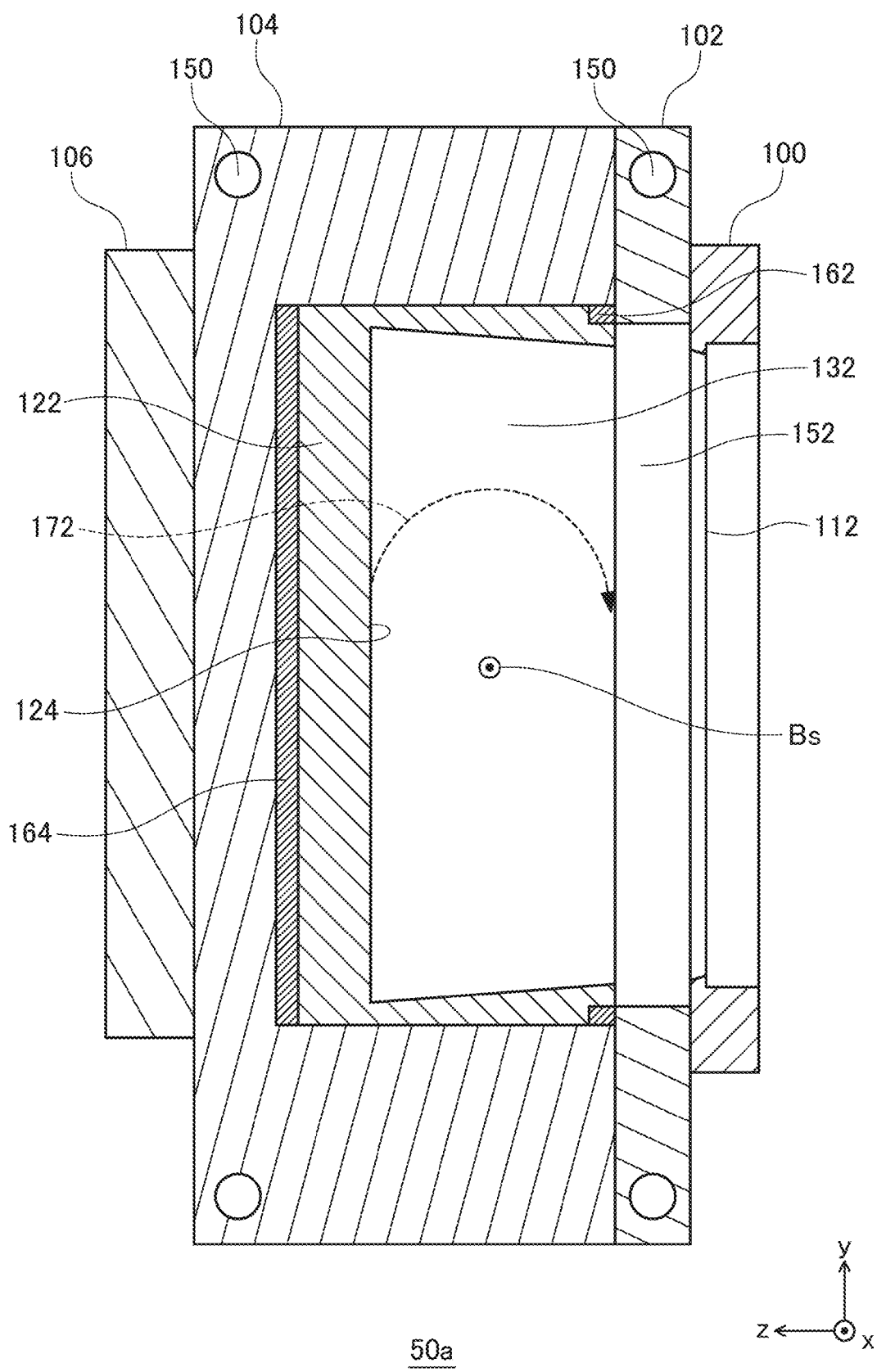
FIG. 6 is a sectional view schematically illustrating a C-C cross section of the beam profiler illustrated in FIG. 3.
Figure 7:
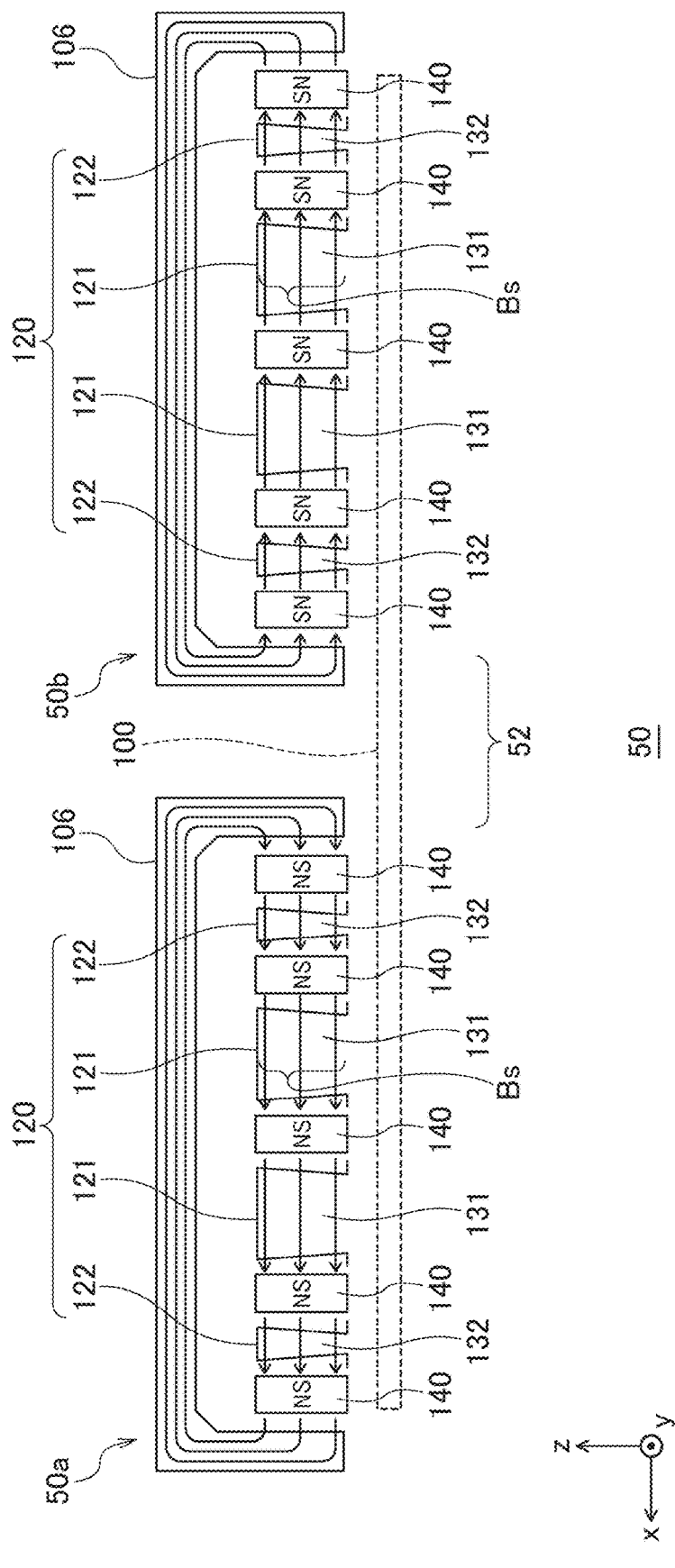
FIG. 7 is a view schematically illustrating a magnetic circuit formed in the beam profiler illustrated in FIG. 3.

FIG. 3 is a perspective view schematically illustrating an appearance of the beam profiler 50 according to the embodiment. FIG. 4 is a sectional view schematically illustrating an A-A cross section of the beam profiler 50 illustrated in FIG. 3. FIG. 5 is a sectional view schematically illustrating a B-B cross section of the beam profiler 50 illustrated in FIG. 3. FIG. 6 is a sectional view schematically illustrating a C-C cross section of the beam profiler 50 illustrated in FIG. 3. FIG. 7 is a view schematically illustrating a magnetic circuit formed in the beam profiler 50 illustrated in FIG. 3.

As illustrated in FIG. 3, the beam profiler 50 is configured with substantially two sub-units, that is, a first sub-unit 50a and a second sub-unit 50b. With respect to a center portion 52 of the beam profiler 50, the first sub-unit 50a is disposed on the left and the second sub-unit 50b is disposed on the right when facing the beam profiler 50. The two sub-units are disposed side by side with each other in the x-direction. The first sub-unit 50a and the second sub-unit 50b are basically bilaterally symmetric and have similar configurations. Hereinafter, in order to simplify the explanation, points common to the two sub-units will be described by taking the first sub-unit 50a as an example.

The beam profiler 50 includes a front plate 100, a cooling plate 102, a cooling block 104, and a yoke 106, which are disposed and assembled in order from the upstream side in the traveling direction of the ion beam IB. Each of the front plate 100 and the cooling plate 102 is provided as a single component, and left portions of the two plates form a part of the first sub-unit 50a and right portions thereof form a part of the second sub-unit 50b. The cooling block 104, the yoke 106, and various configuring components housed inside the beam profiler 50 are provided for each sub-unit. For example, two of the yokes 106 are provided in the beam profiler 50. The first sub-unit 50a includes one yoke 106, and the second sub-unit 50b includes the other yoke 106.

The front plate 100 is disposed so as to provide a front surface of the beam profiler 50, which is irradiated with the ion beam IB, and forms an aperture array 110. As described above, since a scanning is performed in the x-direction with the ion beam IB incident into the beam profiler 50, a region that can be irradiated with the ion beam IB in an xy-plane is elongated along x-direction. Dimensions of the front plate 100 in the x-direction and the y-direction are defined such that a horizontally long ion beam irradiation region 108 fits in the front surface of the front plate 100. Accordingly, when the ion beam IB is incident into the beam profiler 50, an outside of the front plate 100 is not irradiated with the ion beam. The front plate 100 is formed of, for example, graphite. Alternatively, the front plate 100 may be formed of a metal such as a refractory metal or another suitable conductor.

The aperture array 110 includes a plurality of first apertures 111 and a plurality of second apertures 112. Although the first apertures 111 have the first same shape and the second apertures 112 also have the second same shape when viewed from the traveling direction of the ion beam IB (that is, the z-direction), the first aperture 111 and the second aperture 112 have shapes different from each other.

In the embodiment, the first apertures 111 are elongated in the x-direction and the second apertures 112 are elongated in the y-direction. The first apertures 111 are formed in the front plate 100 as horizontally long slits extending in the x-direction, and the second apertures 112 are formed in the front plate 100 as vertically long slits extending in the y-direction.

It is preferable that a slit length (length in the y-direction) of the second aperture 112 corresponds to the length of the ion beam IB in the y-direction, or is somewhat longer than the length of the ion beam IB in the y-direction. The second aperture 112 can receive the entire width of the ion beam IB in the y-direction. A slit length (length in the x-direction) of the first aperture 111 is relatively short (for example, shorter than the slit length of the second aperture 112). For this reason, even when the plurality of first apertures 111 are arranged in the x-direction in the beam profiler 50, a margin is likely to be reserved in the remaining space, and the plurality of second apertures 112 can be easily disposed in the x-direction. The first aperture 111 and the second aperture 112 may have the same slit with or slit widths different from each other (dimensions in a direction perpendicular to the slit length) from each other.

The first apertures 111 are arranged in the y-direction, and the second apertures 112 are arranged in the x-direction. In the embodiment, the plurality of first apertures 111 and the plurality of second apertures 112 are provided individually for each sub-unit. As illustrated in FIG. 3, the first sub-unit 50a is provided with two of the second apertures 112, and a group of the first apertures 111 are disposed between the second apertures 112 in the x-direction. The first apertures 111 are disposed in a zigzag pattern in two rows in the y-direction. Six of the first apertures 111 are arranged in one row, and five of the first apertures 111 are arranged in the other row. In total, twenty two of the first apertures 111 and four of the second apertures 112 are formed in the beam profiler 50.

A plurality of first recessed portions are formed in the front surface of the front plate 100, and each of the first apertures 111 is formed in each of the first recessed portions. The first apertures 111 penetrate the front plate 100 in the z-direction. Similarly, a plurality of second recessed portions are formed in the front surface of the front plate 100, and each of the second apertures 112 is formed in each of the second recessed portions. The second apertures 112 penetrate the front plate 100 in the z-direction. When viewed from the z-direction, the first aperture 111 is positioned at the center of the first recessed portion and the second aperture 112 is positioned at the center of the second recessed portion, respectively.

As illustrated in FIG. 4, each of the plurality of first apertures 111 provides a first beam portion $IB_1$ of the ion beam IB. Each of the plurality of second apertures 112 provides a second beam portion $IB_2$ of the ion beam IB. In other words, with respect to the ion beam IB, a portion that is cut out from the ion beam IB by the first aperture 111 and passes through the first aperture 111 is the first beam portion $IB_1$, and a portion that is cut out from the ion beam IB by the second aperture 112 and passes through the second aperture 112 is the second beam portion $IB_2$. The front plate 100 is irradiated with other portions of the ion beam IB excluding the first beam portion $IB_1$ and the second beam portion $IB_2$ and the other portions of the ion beam IB are blocked by the front plate 100.

The first aperture 111 and the second aperture 112 may expand in tapered shapes toward the downstream side (upward in FIG. 4) in the z-direction. By doing so, incidence of ions into tapered side surfaces of the apertures is avoided. Therefore, emission of secondary ions and secondary electrons that can be generated as a result of the incidence can be suppressed.

The beam profiler 50 further includes a cup electrode array 120 disposed to be fixed with respect to the aperture array 110. An array of Faraday cups, in which multiple Faraday cups are two-dimensionally arranged in the xy-plane, is configured in the beam profiler 50 by the aperture array 110 and the cup electrode array 120.

The cup electrode array 120 includes a plurality of first cup electrodes 121 and a plurality of second cup electrodes 122. The plurality of first cup electrodes 121 are arranged in the y-direction so as to correspond to the plurality of first apertures 111, and the plurality of second cup electrodes 122 are arranged in the x-direction so as to correspond to the plurality of second apertures 112. The beam profiler 50 is provided with the first cup electrodes 121, the number of which is the same as that of the first apertures 111, and is provided with the second cup electrodes 122, the number of which is the same as that of the second apertures 112. One Faraday cup is configured with a combination of one aperture and one cup electrode corresponding thereto. Although the cup electrode is formed of, for example, graphite, similar to the front plate 100, the cup electrode may be formed of a metal or another suitable conductor.

In the embodiment, since a group of the first apertures 111 are disposed in the zigzag pattern in the two rows in the y-direction in the first sub-unit 50a, a group of the first cup electrodes 121 are disposed on the downstream side of the group of first apertures 111, and are disposed in the zigzag pattern in the two rows in the y-direction, similar to the array of the first apertures 111. In addition, the second cup electrodes 122 are disposed on both sides of the group of first cup electrodes 121 in the x-direction, and the second cup electrodes 122 are disposed on the downstream side of the two second apertures 112 of the first sub-unit 50a.

The first cup electrode 121 defines a first cavity 131 and the second cup electrode 122 defines a second cavity 132. Each of the plurality of first cup electrodes 121 is disposed such that the first beam portion $IB_1$ is incident from the first aperture 111 through the first cavity 131. Each of the plurality of second cup electrodes 122 is disposed such that the second beam portion $IB_2$ is incident from the second aperture 112 through the second cavity 132. Each of the first cup electrode 121 and the first cavity 131 has an elongated shape in the x-direction so as to correspond to the first aperture 111. Each of the second cup electrode 122 and the second cavity 132 has an elongated shape in the y-direction so as to correspond to the second aperture 112.

A shape of the first cavity 131 is defined such that the first beam portion $IB_1$ is incident into only a bottom surface 123 of the first cup electrode 121 facing the first aperture 111. Accordingly, the first beam portion $IB_1$ is not incident into a side surface of the first cup electrode 121. In order to make this more reliable, the first cavity 131 may be expanded in a direction perpendicular to the z-direction as going away from the first aperture 111 in the z-direction. As illustrated in FIG. 4, the first cavity 131 may be expanded in the x-direction as going away from the first aperture 111 in the z-direction. As illustrated in FIG. 5, the first cavity 131 may be expanded also in the y-direction as going away from the first aperture 111 in the z-direction. Angles $\alpha_1$ and $\alpha_2$ of the side surface with respect to the bottom surface 123 in the first cup electrode 121 may be, for example, larger than 80 degrees and smaller than 90 degrees. The angles $\alpha_1$ and $\alpha_2$ may be larger than 85 degrees. In other words, an angle formed between the first beam portion $IB_1$ and the side surface of the first cup electrode 121 at an entrance of the first cup electrode 121 may be, for example, less than 10 degrees or less than 5 degrees.

Similarly, a shape of the second cavity 132 is defined such that the second beam portion $IB_2$ is incident into only a bottom surface 124 of the second cup electrode 122 facing the second aperture 112. The second beam portion $IB_2$ is not incident into a side surface of the second cup electrode 122. The second cavity 132 may be expanded in the direction perpendicular to the z-direction as going away from the second aperture 112 in the z-direction. As illustrated in FIG. 4, the second cavity 132 may be expanded in the x-direction as going away from the second aperture 112 in the z-direction. As illustrated in FIG. 6, the second cavity 132 may be expanded also in the y-direction as going away from the second aperture 112 in the z-direction. Also an angle of the side surface with respect to the bottom surface 124 in the second cup electrode 122 may be, for example, larger than 80 degrees (or 85 degrees) and smaller than 90 degrees. An angle formed between the second beam portion $IB_2$ and the side surface of the second cup electrode 122 at an entrance of the second cup electrode 122 may be, for example, less than 10 degrees or less than 5 degrees.

As described above, making ions, which are incident into the beam profiler 50, incident into only the bottom surfaces without making the ions incident into the side surfaces of the cup electrodes is advantageous in reducing suppression magnetic fields Bs (to be described later) that prevent secondary ions and secondary electrons, which can be generated from the cup electrode, from being escaped to the outside of the cavity.

In addition, the slit width (width in the y-direction) of the first aperture 111 is smaller than the width of the first cavity 131 in the y-direction. The slit width (width in the x-direction) of the second aperture 112 is smaller than the width of the second cavity 132 in the x-direction. By making the aperture narrower than the cavity of the cup electrode, a risk that incident ions are reflected by the electrode in the cavity and escape to the outside of the cavity or that secondary electrons or secondary ions escape to the outside of the cavity is reduced.

Further, the beam profiler 50 includes a plurality of magnets 140 that apply a magnetic field to the first cavities 131 and the second cavities 132 along an in-plane direction in the xy-plane. The magnetic field has an effect of suppressing the escape of secondary ions and secondary electrons, which can be generated from the cup electrodes, to the outside of the cavity.

In the embodiment, the plurality of magnets 140 are disposed side by side with the first cup electrode 121 and the second cup electrode 122 in the x-direction. Arraying the magnets 140 in the x-direction helps making the size of the beam profiler 50 small. Since the first cup electrode 121 and the second cup electrode 122 are arranged with an interval in the x-direction, the interval can be used as a storage space for the magnet 140.

The plurality of magnets 140 are disposed alternately with the first cup electrodes 121 and the second cup electrodes 122 in the x-direction. By doing so, a required magnetic field can be generated by the relatively small magnets 140. For example, compared to a case where the magnets 140 are disposed only at both ends of a cup electrode row in which the first cup electrodes 121 and the second cup electrodes 122 are arranged, it is easy to generate a stronger magnetic field in a center portion of the cup electrode row.

In addition, the plurality of magnets 140 are disposed such that each of the magnets 140 is adjacent, in the x-direction, to the first cup electrode 121, the second cup electrode 122, or both of the first cup electrode 121 and the second cup electrode 122. By doing so, the magnets 140 can be disposed nearby the first cup electrodes 121 and the second cup electrodes 122, and a required magnetic field can be generated by the relatively small magnets 140. In particular, in a case where the magnets are disposed on both sides of the cup electrode, it is easy to generate a strong magnetic field in the cavity of the cup electrode.

In the embodiment, as illustrated in FIG. 4, the second cup electrode 122, the first cup electrode 121, the first cup electrode 121, and the second cup electrode 122 are arranged in order in the x-direction. Thus, five of the magnets 140 are disposed alternately with the cup electrodes. In addition, the magnets 140 are disposed on both sides of any cup electrode. One or a plurality of magnets out of the five magnets 140 may be omitted insofar as a required magnetic field is generated.

A cup electrode/magnet row formed by arranging the first cup electrodes 121, the second cup electrodes 122, and the plurality of magnets 140 in the x-direction is disposed downstream of the front plate 100, and the cooling plate 102 is disposed between the cup electrode/magnet row and the front plate 100. The cooling plate 102 has a somewhat larger xy-dimension than that of the front plate 100, and the front plate 100 is fixed to the front surface of the cooling plate 102. The cooling block 104 surrounds the cup electrode/magnet row. The cooling block 104 is disposed downstream of the cooling plate 102, surrounds the cup electrode/magnet row together with the cooling plate 102, and is in thermal contact therewith. The first cup electrodes 121, the second cup electrodes 122, and the magnets 140 are fixed to the cooling plate 102 and/or the cooling block 104. The cup electrode/magnet row and the cooling block 104 are disposed inside of the yoke 106. The yoke 106 extends in a U-shape (C-shape) along an outer surface of the cooling block 104.

The cooling plate 102 configures, together with the cooling block 104, a cooling system for cooling the beam profiler 50. The cooling system is configured to suppress an excessive temperature rise attributable to heat input to the beam profiler 50 accompanying the irradiation of the ion beam IB, and to control the beam profiler 50 to have an appropriate temperature. The front plate 100 is cooled by the cooling plate 102. In addition, the cooling block 104 can mainly and efficiently remove heat generated in the cup electrodes accompanying the incidence of ions into the cup electrodes.

Although the cooling plate 102 and the cooling block 104 are formed of, for example, an aluminum material, the cooling plate 102 and the cooling block 104 may be formed of another suitable metal or a high thermal conductivity material. As illustrated in FIGS. 4 to 6, a refrigerant flow path 150 for flowing a refrigerant (for example, cooling water) is formed in various places in the cooling plate 102 and the cooling block 104. In the exemplary configuration, a refrigerant flow inlet is provided in a side surface of the cooling plate 102, and the refrigerant is supplied to the refrigerant flow path 150 in the cooling plate 102 from the refrigerant flow inlet. The refrigerant flows to the refrigerant flow path 150 in the cooling block 104 of the first sub-unit 50a, flows to the refrigerant flow path 150 in the cooling block 104 of the second sub-unit 50b via the refrigerant flow path 150 in the cooling plate 102, and returns to the refrigerant flow path 150 in the cooling plate 102. The refrigerant flow out from a refrigerant flow outlet provided in another side surface of the cooling plate 102.

Since the cooling plate 102 is disposed between the front plate 100 and the cup electrode/magnet row, a first through-hole 151 penetrating the cooling plate 102 in the z-direction is formed in the cooling plate 102 to connect the first aperture 111 to the first cavity 131 of the first cup electrode 121 as illustrated in FIG. 4. The first beam portion $IB_1$ enters the first cavity 131 from the first aperture 111 through the first through-hole 151. Similarly, a second through-hole 152 is formed in the cooling plate 102, and the second beam portion $IB_2$ enters the second cavity 132 from the second aperture 112 through the second through-hole 152.

In addition, insulating members for electrically insulating the first cup electrode 121 and the second cup electrode 122 from the surrounding conductors are provided. For example, a first front insulator 161 is disposed to surround the entrance of the first cup electrode 121 into the first cavity 131, and is sandwiched between the cooling plate 102 and a front surface of the first cup electrode 121. A second front insulator 162 is disposed to surround the entrance of the second cup electrode 122 into the second cavity 132, and is sandwiched between the cooling plate 102 and a front surface of the second cup electrode 122. A first back insulator 163 is sandwiched between a back surface of the first cup electrode 121 and the cooling block 104, and a second back insulator 164 is sandwiched between a back surface of the second cup electrode 122 and the cooling block 104. Such insulating members are formed of, for example, ceramics such as aluminum nitride, or another appropriate insulating material.

A measurement circuit substrate that measures a beam current of the first beam portion $IB_1$ incident into the first cup electrode 121 may be disposed in the vicinity of the first back insulator 163, for example, adjacent to a back surface of the first back insulator 163. Similarly, another measurement circuit substrate that measures a beam current of the second beam portion $IB_2$ incident into the second cup electrode 122 may be disposed in the vicinity of the second back insulator 164, for example, adjacent to a back surface of the second back insulator 164.

The first apertures 111 and the second apertures 112 may be disposed to avoid a place, which is irradiated with the ion beam IB (also referred to as a stationary ion beam) when the scanning by the beam scanner 34 is not performed. In the embodiment, the center portion 52 of the beam profiler 50 is irradiated with the stationary ion beam.

Therefore, as illustrated in FIG. 3, the first apertures 111 and the second apertures 112 are disposed to avoid the center portion 52 of the beam profiler 50. The first apertures 111 and the second apertures 112 are not irradiated with the stationary ion beam. In this manner, the center portion 52 of the beam profiler 50 is used as an irradiation position for the stationary ion beam, and the front plate 100 can function as a beam damper.

If there was an aperture at the irradiation position for the stationary ion beam, the beam might be continuously incident into the corresponding cup electrode from the aperture that received the irradiation while the beam was on standby, and thereby the cup electrode might be excessively heated. However, as described above, since the aperture is disposed to avoid the irradiation position for the stationary ion beam, such a problem is avoided.

In addition, referring to FIG. 3, the two second apertures 112 positioned at both ends (that is, near a left edge and near a right edge) in the front plate 100 are respectively positioned at end portions of a region on the front plate 100, into which the ion beam IB is incident, in the scanning direction. The beam profiler 50 may be configured such that at least one of the second apertures 112 at both ends is positioned outside an outer periphery of the wafer W positioned at the implantation position in the implantation processing chamber 60 when viewed from the z-direction. By doing so, the ion beam IB can pass through the outside of the wafer W during ion implantation, and the beam profiler 50 can receive the ion beam with the second aperture 112 and measure a beam current. The beam measurement results may be used in order to control the ion beam IB, for example during the ion implantation where the beam measurement is performed or at the next ion implantation.

Next, the magnetic circuit formed in the beam profiler 50 will be described with reference to FIG. 7. As described above, the first sub-unit 50a of the beam profiler 50 includes a first portion of the cup electrode array 120, including a first group of the first cup electrodes 121 and a first group of the second cup electrodes 122, and a first portion of the plurality of magnets 140. Similarly, the second sub-unit 50b includes a second portion of the cup electrode array 120, including a second group of the first cup electrodes 121 and a second group of the second cup electrode 122, and a second portion of the plurality of second magnets 140. The first portion and second portion of the cup electrode array 120 are disposed side by side with each other in the x-direction.

The plurality of magnets 140 are disposed such that opposite magnetic poles (that is, N-poles and S-poles) of the respective magnets 140 are alternately arranged along the x-direction. The magnets 140 are permanent magnets. The yoke 106 is a return yoke that magnetically couples two of the plurality of magnets 140 disposed at both ends in the x-direction to each other. The yoke 106 is formed of, for example, pure iron or another soft magnetic material. With such a magnetic circuit, the magnets 140 apply the suppression magnetic field Bs to the first cavities 131 and the second cavities 132 along the x-direction, as illustrated in FIG. 7. The suppression magnetic field Bs is mainly applied to the downstream side of the front plate 100.

In the embodiment, the first portion of the plurality of magnets 140 apply a magnetic field to the first cavities 131 and the second cavities 132 in a first direction along the x-direction in the first portion of the cup electrode array 120. The second portion of the plurality of second magnets 140 apply a magnetic field to the first cavities 131 and the second cavities 132 in a second direction along the x-direction in the second portion of the cup electrode array 120, the second direction being opposite to the first direction. As illustrated in FIG. 7, in the first sub-unit 50a, all of the magnets 140 are disposed with the N-poles on the left and the S-poles on the right. On the contrary, in the second sub-unit 50b, all of the magnets 140 are disposed with the S-poles on the left and the N-poles on the right.

In this manner, when magnetisms in the right and left sub-units are in mutually opposite directions, the magnetic field generated by the magnets 140 of the right and left sub-units can be made plane-symmetric. As a result, a leakage magnetic field at the center portion 52 of the beam profiler 50 can be suppressed. When detecting a beam current of the ion beam IB at the center portion 52 of the beam profiler 50 (particularly in a case where the center portion 52 of the beam profiler 50 is irradiated with the ion beam IB when a scanning is not performed), the leakage magnetic field can affect the ion beam IB. By suppressing the leakage magnetic field, the beam current of the ion beam IB can be detected more accurately.

An exemplary method for designing the magnitude of the suppression magnetic field Bs will be described. In the embodiment, all of entering ions are incident into the bottom surfaces of the cup electrodes. When secondary ions are generated by the incidence, the secondary ions are generated only from the bottom surfaces of the cup electrodes. Since no ion hits the side surfaces of the cup electrodes, no secondary ion is generated therefrom.

As the secondary ion, the heaviest singly charged ion assumed in design (for example, an arsenic singly charged ion in a case where boron, phosphorus, argon, or arsenic can be used as implanted ion species in the ion implanter 1) is considered. The trajectory having the smallest bending radius, out of trajectories, which allow the secondary ion to be generated from the bottom surface of the cup electrode and to escape from the cavity, is geometrically calculated.

In a case where the suppression magnetic field Bs is in the x-direction, the trajectory having the smallest bending radius is an arc that starts from a lower end of the bottom surface 123 of the first cup electrode 121 and reaches a lower end of the entrance of the first cup electrode 121 as indicated with a dashed arrow 171 in FIG. 5. The arc comes into contact with an upper side surface of the first cup electrode 121. As for the second cup electrode 122, the trajectory is a semicircle that starts from the bottom surface 124 of the second cup electrode 122 and reaches the entrance of the second cup electrode 122 as indicated with a dashed arrow 172 in FIG. 6.

The smallest magnetic field that causes the assumed secondary ion to make a circular motion indicated with the arrows 171 and 172 can be calculated. Therefore, the magnets 140 are designed to apply the suppression magnetic field Bs exceeding the smallest magnetic field to the cavities of the cup electrodes. Then, since the secondary ion makes a circular motion with a radius smaller than the smallest bending radius, the secondary ion is prevented from escaping from the cavities. Since the heaviest ion is considered, lighter secondary ions and secondary electrons are also prevented from escaping.

Accordingly, the suppression magnetic field Bs generated by the magnets 140 can confine the secondary ions and the secondary electrons, which can be generated in the cup electrodes, in the cavities. Since the ions incident as the ion beam IB have remarkably high energy (for example, hundreds to thousands times or more) compared to the secondary ions, the ion beam IB is not substantially affected by the suppression magnetic field Bs.

Figure 8:
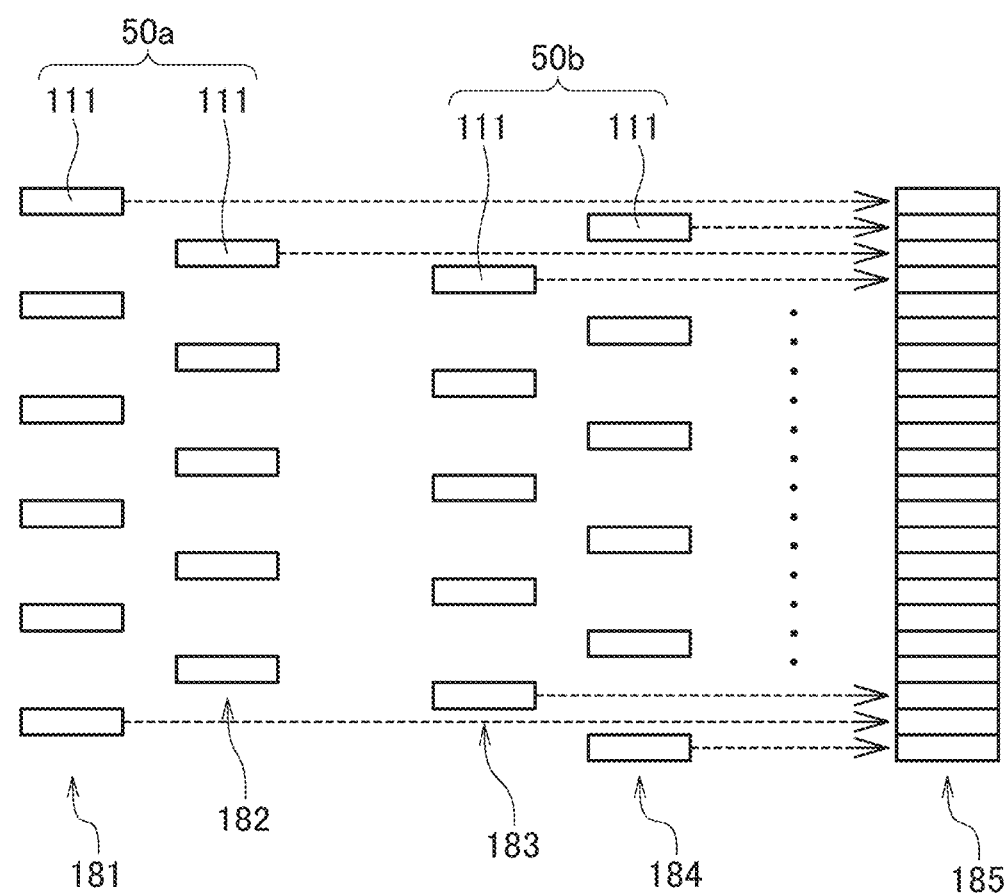
FIG. 8 is a view schematically illustrating a rule of arrangement of first apertures applicable to the beam profiler illustrated in FIG. 3.

FIG. 8 is a view schematically illustrating a rule of arrangement of the first apertures 111 applicable to the beam profiler 50 illustrated in FIG. 3. The plurality of first apertures 111 are disposed in at least two rows such that respective positions of the first apertures 111 in one row are shifted from respective positions of the first apertures 111 in another row in the y-direction. When viewed from the x-direction, the first apertures 111 in the at least two rows are arranged in the y-direction with no gapping between each other.

As described above, the first apertures 111 of the first sub-unit 50a are disposed in the zigzag pattern in the two rows in the y-direction. Six of the first apertures 111 are arranged in a left row 181, and five of the first apertures 111 are arranged in a right row 182. Similarly, the first apertures 111 of the second sub-unit 50b are disposed in the zigzag pattern in the two rows in the y-direction. Five of the first apertures 111 are arranged in a left row 183, and six of the first apertures 111 are arranged in a right row 184. The first apertures 111 of the second sub-unit 50b are disposed to be shifted from respective positions of the first apertures 111 of the first sub-unit 50a in the y-direction. In this manner, the first apertures 111 in the four rows (181 to 184) have positions different from each other in the y-direction.

When viewed from the x-direction, the first apertures 111 in the four rows are arranged in the y-direction with no gapping between each other. The first apertures 111 are arranged in order of the row 181, the row 184, the row 182, and the row 183 from top to bottom.

In this manner, a one-dimensional array 185 of the first apertures 111 densely arrayed in the y-direction can be virtually created. Actually manufacturing such an array in a row in the y-direction is difficult since the first apertures 111 adjacent to each other are integrated and the first cup electrodes 121 adjacent to each other behind the first apertures 111 physically interfere with each other. However, in the embodiment, as beam currents to be detected by the first cup electrodes 121 through the respective first apertures 111 are integrated so as to correspond to the positions in the y-direction, an array of Faraday cups densely arrayed in the y-direction can be virtually constructed, and thereby the beam current distribution with high resolution can be obtained.

The first apertures 111 in different rows may be arranged so as to partially overlap each other in the y-direction. Alternatively, the first apertures 111 in different rows may be arranged in the y-direction with some gapping therebetween. In any case, an array of Faraday cups denser than an array of Faraday cups configured with only a single row (for example, the row 181) can be virtually constructed, and the beam current distribution with high resolution can be obtained.

As described above, in the beam profiler 50 according to the embodiment, the first apertures 111 and the second apertures 112 have different shapes from each other when viewed from the z-direction. For this reason, regarding the beam current distribution of the ion beam IB, different information can be obtained depending on different aperture shapes.

Since each of the first apertures 111 has an elongated shape in the x-direction, a horizontally long Faraday cup is formed in combination with the corresponding first cup electrode 121. Accordingly, a beam current at a position of each of the first apertures 111 in the y-direction can be measured. Since a plurality of sets of the first aperture 111 and the first cup electrode 121, that is, a plurality of horizontally long Faraday cups are arrayed in the y-direction, the beam profiler 50 can measure the beam current distribution of the ion beam IB in the y-direction. In particular, since the plurality of first apertures 111 in the rows (181 to 184) virtually construct the highly dense one-dimensional array 185 of the horizontally long Faraday cups as described above, the beam profiler 50 can obtain the beam current distribution with high resolution.

Since each of the second apertures 112 has an elongated shape in the y-direction, a vertically long Faraday cup is formed in combination with the corresponding second cup electrode 122. Accordingly, a beam current at a position of each of the second apertures 112 in the x-direction can be measured. Since a plurality of sets of the second aperture 112 and the second cup electrode 122, that is, a plurality of vertically long Faraday cups are arrayed in the x-direction, the beam profiler 50 can measure the beam current distribution of the ion beam IB in the x-direction.

The beam profiler 50 is configured to apply the suppression magnetic field Bs to the first cavities 131 and the second cavities 132 along the direction perpendicular to the z-direction (for example, the x-direction). The suppression magnetic field Bs suppresses the escape of secondary ions and secondary electrons, which can be generated by ions incident into the cavities of the cup electrodes, from the cavities, and accordingly inflow of the secondary ions and the secondary electrons to the cavities of the other cup electrodes can be suppressed. Therefore, a measurement error of the beam current in each of the Faraday cups caused by such secondary charged particles can be prevented or reduced. The beam profiler 50 can accurately measure the beam current distribution of the ion beam IB.

As a result of preventing or reducing such a measurement error, the plurality of Faraday cups (aperture/cup electrode pairs) can be disposed nearby, thereby helping designing a compact beam profiler. In addition, disposing the plurality of Faraday cups nearby also helps measuring the beam current distribution with higher resolution.

A sandwich structure in which each of the cup electrodes is sandwiched between two of the magnets 140 also helps designing a compact beam profiler.

The present invention has been described herein before based on the embodiment. It is clear for those skilled in the art that the present invention is not limited to the embodiment, various design changes are possible, various modification examples are possible, and such modification examples are also within the scope of the present invention.

The beam profiler 50 may have three or more sub-units. Instead of being configured with a plurality of sub-units, the beam profiler 50 may be configured with a single unit.

An aperture shape, an aperture direction, an array configuration of apertures, and the number of apertures can vary. For example, it is not essential that the shape of the aperture is elongated. The first aperture 111 (and/or the second aperture 112) may have a circular shape, a rectangular shape, or another shape. In addition, the first aperture 111 (and/or the second aperture 112) may extend in an oblique direction. The aperture array 110 may include only one first aperture 111 and/or may include only one second aperture 112. The aperture array 110 may include a third aperture different from the first aperture 111 and the second aperture 112.

In the embodiment described above, the suppression magnetic field Bs is directed in the x-direction in the first cavities 131 and the second cavities 132. However, the beam profiler 50 may include a plurality of magnets that apply the suppression magnetic field Bs to the first cavities 131 and the second cavities 132 along another in-plane direction (for example, they-direction) in the xy-plane. In this case, the plurality of magnets may be disposed such that the first cup electrode 121 (and/or the second cup electrode 122) is sandwiched therebetween in the y-direction.

Although the beam profiler 50 is disposed in the most downstream of a beamline of the ion implanter 1 in the embodiment described above, a place where the beam profiler 50 is disposed is not limited thereto. The beam profiler 50 may be disposed in another place in the implantation processing chamber 60 or in another place in the ion implanter 1. Just as the mask plate 56 or the beam current measurement unit 70, the beam profiler 50 may be configured to be movable to be inserted on a beam trajectory during beam measurement and to be retracted from the beam trajectory during ion implantation.

In the embodiment described above, the ion implanter 1 is configured with a so-called hybrid scan type (a type in which ion implantation is performed on the entire area of the wafer W to be irradiated by a scanning in the x-direction with the ion beam IB and reciprocating of the wafer W in the y-direction). The beam profiler 50 is not limited to the application to the ion implanter 1 of this type. The beam profiler 50 is also applicable to other types of ion implanters.

The embodiment of the present invention can also be expressed as follows.

1. An ion implanter including:
   a beam scanner that performs a scanning with an ion beam in a scanning direction perpendicular to a traveling direction of the ion beam; and
   a beam profiler that is disposed down stream of the beam scanner and measures a beam current distribution of the ion beam when the scanning by the beam scanner is performed,
   in which the beam profiler includes
   an aperture array that includes a first aperture which provides a first beam portion of the ion beam and a second aperture which has a shape different from that of the first aperture when viewed from an upstream side in the traveling direction and provides a second beam portion of the ion beam,
   a cup electrode array that is disposed to be fixed with respect to the aperture array, the cup electrode array including a first cup electrode which defines a first cavity and is disposed such that the first beam portion is incident from the first aperture through the first cavity and a second cup electrode which defines a second cavity and is disposed such that the second beam portion is incident from the second aperture through the second cavity, and
   a plurality of magnets that apply a magnetic field to the first cavity and the second cavity along an in-plane direction in a plane perpendicular to the traveling direction.

2. The ion implanter according to first embodiment,
wherein the plurality of magnets are disposed side by side with the first cup electrode and the second cup electrode in the scanning direction and apply the magnetic field to the first cavity and the second cavity along the scanning direction.

3. The ion implanter according to first embodiment,
wherein the plurality of magnets are disposed such that opposite magnetic poles of the respective magnets are alternately arranged along the scanning direction.

4. The ion implanter according to first embodiment,
wherein the plurality of magnets are disposed alternately with the first cup electrode and the second cup electrode in the scanning direction.

5. The ion implanter according to first embodiment,
wherein the plurality of magnets are disposed such that each of the magnets is adjacent, in the scanning direction, to the first cup electrode, the second cup electrode, or both of the first cup electrode and the second cup electrode.

6. The ion implanter according to first embodiment,
wherein the beam profiler includes a yoke that magnetically couples two of the plurality of magnets disposed at both ends in the scanning direction to each other.

7. The ion implanter according to first embodiment,
wherein the beam profiler includes a first cup electrode array, a second cup electrode array, a plurality of first magnets, and a plurality of second magnets,
the first cup electrode array and the second cup electrode array are disposed side by side with each other in the scanning direction,
the plurality of first magnets apply the magnetic field to the first cavity and the second cavity in a first direction along the scanning direction in the first cup electrode array, and
the plurality of second magnets apply the magnetic field to the first cavity and the second cavity in a second direction along the scanning direction in the second cup electrode array, the second direction being opposite to the first direction.

8. The ion implanter according to first embodiment,
wherein the aperture array includes a plurality of the first apertures arranged in a beam width direction of the ion beam, which is perpendicular to the scanning direction and the traveling direction,
the cup electrode array includes a plurality of the first cup electrodes arranged in the beam width direction so as to correspond to the plurality of first apertures,
each of the plurality of first apertures provides each of a plurality of the first beam portions of the ion beam,
each of the plurality of first cup electrodes defines each of a plurality of the first cavities, and
each of the plurality of first cup electrodes is disposed such that each of the plurality of first beam portions is incident from each of the plurality of first apertures through each of the plurality of first cavities.

9. The ion implanter according to eighth embodiment,
wherein the plurality of first apertures are disposed in at least two rows such that respective positions of the first apertures in one row are shifted from respective positions of first apertures in another row in the beam width direction, and
when viewed from the scanning direction, the plurality of first apertures in the at least two rows are arranged with no gapping between each other or partially overlapping each other in the beam width direction.

10. The ion implanter according to first embodiment,
wherein the first aperture is elongated in the scanning direction, and the second aperture is elongated in a beam width direction of the ion beam perpendicular to the scanning direction and the traveling direction.

11. The ion implanter according to first embodiment,
wherein the aperture array includes a plurality of the second apertures arranged in the scanning direction,
the cup electrode array includes a plurality of the second cup electrodes arranged in the scanning direction so as to correspond to the plurality of second apertures,
each of the plurality of second apertures provides each of a plurality of the second beam portions of the ion beam,
each of the plurality of second cup electrodes defines each of a plurality of the second cavities, and
each of the plurality of second cup electrodes is disposed such that each of the plurality of second beam portions is incident from each of the plurality of second apertures through each of the plurality of second cavities.

12. The ion implanter according to first embodiment,
wherein the first aperture and the second aperture are disposed to avoid a place, which is irradiated with the ion beam when the scanning by the beam scanner is not performed.

13. The ion implanter according to first embodiments,
wherein the first cavity expands in a direction perpendicular to the traveling direction as going away from the first aperture in the traveling direction and/or the second cavity expands in a direction perpendicular to the traveling direction as going away from the second aperture in the traveling direction.

14. The ion implanter according to first embodiment,
wherein the beam profiler includes a front plate that is disposed as a front surface of the beam profiler, which is irradiated with the ion beam, and the first aperture and the second aperture are formed in the front plate, and
a cup electrode/magnet row formed by arranging the first cup electrode, the second cup electrode, and the plurality of magnets in the scanning direction is disposed downstream of the front plate.

15. The ion implanter according to fourteenth embodiment,
wherein the beam profiler includes a cooling plate disposed between the front plate and the cup electrode/magnet row.

16. The ion implanter according to fourteenth embodiment,
wherein the beam profiler includes a cooling block that at least partially surrounds the cup electrode/magnet row, and
the cup electrode/magnet row and the cooling block are disposed inside of a yoke that magnetically couples two of the plurality of magnets disposed at both ends in the scanning direction to each other.

17. The ion implanter according to first embodiment,
wherein the beam profiler is disposed in the most downstream of a beamline of the ion implanter.

18. A beam profiler including:
an aperture array that includes a first aperture which provides a first beam portion of an ion beam and a second aperture which has a shape different from that of the first aperture when viewed from an upstream side in a traveling direction of the ion beam and provides a second beam portion of the ion beam;
a cup electrode array that is disposed to be fixed with respect to the aperture array, the cup electrode array including a first cup electrode which defines a first cavity and is disposed such that the first beam portion is incident from the first aperture through the first cavity and a second cup electrode which defines a second cavity and is disposed such that the second beam portion is incident from the second aperture through the second cavity; and a plurality of magnets that apply a magnetic field to the first cavity and the second cavity along an in-plane direction in a plane perpendicular to the traveling direction.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
a beam scanner that performs a scanning with an ion beam in a scanning direction perpendicular to a traveling direction of the ion beam; and
a beam profiler that is disposed downstream of the beam scanner and measures a beam current distribution of the ion beam when the scanning by the beam scanner is performed,
wherein the beam profiler includes
an aperture array that includes a first aperture which provides a first beam portion of the ion beam and a second aperture which has a shape different from that of the first aperture when viewed from an upstream side in the traveling direction and provides a second beam portion of the ion beam,
a cup electrode array that is disposed to be fixed with respect to the aperture array, the cup electrode array including a first cup electrode which defines a first cavity and is disposed such that the first beam portion is incident from the first aperture through the first cavity and a second cup electrode which defines a second cavity and is disposed such that the second beam portion is incident from the second aperture through the second cavity, and
a plurality of magnets that apply a magnetic field to the first cavity and the second cavity along an in-plane direction in a plane perpendicular to the traveling direction.

2. The ion implanter according to claim 1,
wherein the plurality of magnets are disposed side by side with the first cup electrode and the second cup electrode in the scanning direction and apply the magnetic field to the first cavity and the second cavity along the scanning direction.

3. The ion implanter according to claim 1,
wherein the plurality of magnets are disposed such that opposite magnetic poles of the respective magnets are alternately arranged along the scanning direction.

4. The ion implanter according to claim 1,
wherein the plurality of magnets are disposed alternately with the first cup electrode and the second cup electrode in the scanning direction.

5. The ion implanter according to claim 1,
wherein the plurality of magnets are disposed such that each of the magnets is adjacent, in the scanning direction, to the first cup electrode, the second cup electrode, or both of the first cup electrode and the second cup electrode.

6. The ion implanter according to claim 1,
wherein the beam profiler includes a yoke that magnetically couples two of the plurality of magnets disposed at both ends in the scanning direction to each other.

7. The ion implanter according to claim 1,
wherein the beam profiler includes a first cup electrode array, a second cup electrode array, a plurality of first magnets, and a plurality of second magnets, the first cup electrode array and the second cup electrode array are disposed side by side with each other in the scanning direction,
the plurality of first magnets apply the magnetic field to the first cavity and the second cavity in a first direction along the scanning direction in the first cup electrode array, and
the plurality of second magnets apply the magnetic field to the first cavity and the second cavity in a second direction along the scanning direction in the second cup electrode array, the second direction being opposite to the first direction.

8. The ion implanter according to claim 1,
wherein the aperture array includes a plurality of the first apertures arranged in a beam width direction of the ion beam, which is perpendicular to the scanning direction and the traveling direction,
the cup electrode array includes a plurality of the first cup electrodes arranged in the beam width direction so as to correspond to the plurality of first apertures,
each of the plurality of first apertures provides each of a plurality of the first beam portions of the ion beam,
each of the plurality of first cup electrodes defines each of a plurality of the first cavities, and
each of the plurality of first cup electrodes is disposed such that each of the plurality of first beam portions is incident from each of the plurality of first apertures through each of the plurality of first cavities.

9. The ion implanter according to claim 8,
wherein the plurality of first apertures are disposed in at least two rows such that respective positions of the first apertures in one row are shifted from respective positions of first apertures in another row in the beam width direction, and
when viewed from the scanning direction, the plurality of first apertures in the at least two rows are arranged with no gapping between each other or partially overlapping each other in the beam width direction.

10. The ion implanter according to claim 1,
wherein the first aperture is elongated in the scanning direction, and
the second aperture is elongated in a beam width direction of the ion beam perpendicular to the scanning direction and the traveling direction.

11. The ion implanter according to claim 1,
wherein the aperture array includes a plurality of the second apertures arranged in the scanning direction,
the cup electrode array includes a plurality of the second cup electrodes arranged in the scanning direction so as to correspond to the plurality of second apertures,
each of the plurality of second apertures provides each of a plurality of the second beam portions of the ion beam,
each of the plurality of second cup electrodes defines each of a plurality of the second cavities, and
each of the plurality of second cup electrodes is disposed such that each of the plurality of second beam portions is incident from each of the plurality of second apertures through each of the plurality of second cavities.

12. The ion implanter according to claim 1,
wherein the first aperture and the second aperture are disposed to avoid a place, which is irradiated with the ion beam when the scanning by the beam scanner is not performed.

13. The ion implanter according to claim 1,
wherein the first cavity expands in a direction perpendicular to the traveling direction as going away from the first aperture in the traveling direction and/or the second cavity expands in a direction perpendicular to the traveling direction as going away from the second aperture in the traveling direction.

14. The ion implanter according to claim 1,
wherein the beam profiler includes a front plate that is disposed as a front surface of the beam profiler, which is irradiated with the ion beam, and the first aperture and the second aperture are formed in the front plate, and a cup electrode/magnet row formed by arranging the first cup electrode, the second cup electrode, and the plurality of magnets in the scanning direction is disposed downstream of the front plate.

15. The ion implanter according to claim 14,
wherein the beam profiler includes a cooling plate disposed between the front plate and the cup electrode/magnet row.

16. The ion implanter according to claim 14,
wherein the beam profiler includes a cooling block that at least partially surrounds the cup electrode/magnet row, and
the cup electrode/magnet row and the cooling block are disposed inside of a yoke that magnetically couples two of the plurality of magnets disposed at both ends in the scanning direction to each other.

17. The ion implanter according to claim 1,
wherein the beam profiler is disposed in the most downstream of a beamline of the ion implanter.

18. A beam profiler comprising:
an aperture array that includes a first aperture which provides a first beam portion of an ion beam and a second aperture which has a shape different from that of the first aperture when viewed from an upstream side in a traveling direction of the ion beam and provides a second beam portion of the ion beam;

a cup electrode array that is disposed to be fixed with respect to the aperture array, the cup electrode array including a first cup electrode which defines a first cavity and is disposed such that the first beam portion is incident from the first aperture through the first cavity and a second cup electrode which defines a second cavity and is disposed such that the second beam portion is incident from the second aperture through the second cavity; and a plurality of magnets that apply a magnetic field to the first cavity and the second cavity along an in-plane direction in a plane perpendicular to the traveling direction.

\* \* \* \* \*